United States Patent
Simeth

(10) Patent No.: US 9,488,695 B2
(45) Date of Patent: Nov. 8, 2016

(54) METHOD AND APPARATUS FOR INDICATING A LOW BATTERY LEVEL

(71) Applicant: Braun GmbH, Kronberg (DE)

(72) Inventor: Martin Simeth, Koenigstein (DE)

(73) Assignee: BRAUN GMBH, Kronberg (DE)

( * ) Notice: Subject to any disclaimer, the term of this patent is extended or adjusted under 35 U.S.C. 154(b) by 143 days.

(21) Appl. No.: 14/570,923

(22) Filed: Dec. 15, 2014

(65) Prior Publication Data

US 2015/0168501 A1    Jun. 18, 2015

(30) Foreign Application Priority Data

Dec. 17, 2013 (EP) .................................... 13197708

(51) Int. Cl.
| | |
|---|---|
| H02J 7/00 | (2006.01) |
| G01R 31/36 | (2006.01) |
| H01M 10/48 | (2006.01) |
| G01R 19/165 | (2006.01) |

(52) U.S. Cl.
CPC ......... *G01R 31/3606* (2013.01); *G01R 31/362* (2013.01); *H01M 10/482* (2013.01); *G01R 19/16542* (2013.01)

(58) Field of Classification Search
CPC .................................................. H02J 7/0031
USPC ......................................................... 320/134
See application file for complete search history.

(56) References Cited

U.S. PATENT DOCUMENTS

| | | | |
|---|---|---|---|
| 5,635,813 A | 6/1997 | Shiga et al. | |
| 5,973,497 A | 10/1999 | Bergk et al. | |
| 6,236,189 B1 | 5/2001 | Franke | |
| 6,529,840 B1 | 3/2003 | Hing | |
| 7,619,391 B2 * | 11/2009 | Loong | G05F 5/00 320/134 |
| 2003/0169019 A1 | 9/2003 | Oosaki | |
| 2004/0257043 A1* | 12/2004 | Takaoka | H02J 7/0029 320/132 |
| 2012/0306655 A1 | 12/2012 | Tan et al. | |
| 2014/0232330 A1* | 8/2014 | Robertson | H01M 2/1022 320/108 |

FOREIGN PATENT DOCUMENTS

| | | |
|---|---|---|
| JP | 07-294610 A | 11/1995 |
| WO | WO 95/34002 A1 | 12/1995 |
| WO | WO 01/78211 A1 | 10/2001 |
| WO | WO 2008/075246 | 6/2008 |

OTHER PUBLICATIONS

Extended European Search Report for CM4008FQ dated May 13, 2014.

* cited by examiner

*Primary Examiner* — Suresh Memula
(74) *Attorney, Agent, or Firm* — Vladimir Vitenberg

(57) ABSTRACT

A method and an apparatus for determining the battery level of a rechargeable battery used in a battery driven apparatus for driving a load and for indicating a low battery level; and a repeating measurement of the battery voltage and a determination of a threshold for indicating the low battery level. The running time of the apparatus while driving the load is accumulated since the last charging and is repeatedly stored as sequenced data-logger entries in a data-logger memory until a reset of the apparatus due to insufficient battery capacity or until charging of the battery. Threshold is determined after the reset based on the data-logger entries and a required remaining running time of the apparatus upon indication of low battery level.

13 Claims, 3 Drawing Sheets

| Battery Voltage | Runtime |
|---|---|
| ... | ... |
| 1.20 V | 40 min |
| 1.18 V | 41 min |
| 1.16 V | 42 min |
| 1.13 V | 43 min |
| 1.10 V | 44 min |
| 1.06 V | 45 min |
| 1.01 V | 46 min |
| 0.95 V | 47 min |
| 0.87 V | 48 min |
|  | Reset |

METHOD AND APPARATUS FOR INDICATING A LOW BATTERY LEVEL

FIELD OF THE INVENTION

The invention relates to a method for determining the battery level of the rechargeable batteries used in a battery driven apparatus for driving a certain load, such as an electric motor, e.g. in an electric toothbrush, shaver or the like, and for indicating a low battery level showing in particular the need to recharge the battery, said method comprising a repeating measurement of the battery voltage and a determination of a threshold for indicating said low battery level. If the threshold is traversed, i.e. exceeded or underrun depending on the observed variable, the low battery level is indicated. Accordingly, the surveillance of the threshold is a determination of the battery level in line with this invention. Further, the invention relates to an apparatus in which the before described method is implemented and/or carried out.

The main field of application of the invention is accordingly the indication of a low battery level in appliances used regularly in daily life for quite a short period during the day, such as a toothbrush or an electric shaver. However, the invention is not restricted to this very preferred application in a toothbrush, an electric shaver or the like, but can be used in connection with all battery driven apparatus' in order to give a precise and reliable indication of a low battery level, indicating thus the need for charging of the rechargeable battery in the apparatus.

In connection with the invention, the term "battery" is used in the sense of "rechargeable battery".

BACKGROUND OF THE INVENTION

Many electric appliances, and in particular those used in daily life like a shaver or toothbrush, are battery driven to allow the user a mobile use and an easy handling of the appliance without the need of an power cable being inserted into the electrical wall socket during use. For ecological reasons and to avoid a frequent change of discharged batteries in the appliances, very often rechargeable batteries are used to power up the appliances. This technique is in particular useful for appliances that are used for a comparatively short time with regard to the idle time of the day.

One key asset for these appliances is a battery level indicator that indicates the need for charging the rechargeable battery (in the following also referred to "battery" only) to the user in order to avoid a breakdown of the appliance due to a discharged battery. This indication of the need to charge the battery shall be in time so that the user is able to finish the actual (normal) use of the appliance and after that, to recharge the battery e.g. by inserting the appliance in docking station having a charge. On the other hand it is to be avoided to indicate the need for charging to early as the user might regard this as a quality problem of the appliance itself.

Battery indicators are currently often based on a measurement of the battery voltage. If the measured battery voltage falls below a predetermined fixed threshold, the low battery level indicator is activated to indicate the need for charging the battery. Such a battery level indicator is disclosed in WO 95/34002 A1 or in WO 01/78211 A1. Further, the WO 2008/075246 A2 discloses a battery charge indicator detecting whether a battery voltage across the battery drops below a threshold value. A controller is determining whether a load of the apparatus is connected to the battery to activate the detector for comparing the battery voltage with the threshold value after the load has been disconnected from the battery.

However, it is difficult to use a fixed predetermined threshold as the battery voltage depends on many different environmental parameters and is not in all cases directly correlated to the remaining capacity of the battery defining the remaining battery power. For NiMH rechargeable batteries, for example, there is only low correlation between battery voltage and capacity. Therefore a discrepancy between a displayed battery level indicator and the real battery status is very likely.

Another disadvantage of detecting low battery level by a predetermined fixed voltage threshold measurement is that due to a wide variety of battery behavior (by distribution, temperature, current consumption, aging or the like) it is impossible, to find a universally valid voltage limit, that matches a low battery level under all conditions. So, the user will either get a low battery indication too early or too late to react and charge the battery before a breakdown. In both cases, the user or consumer will be unsatisfied with the battery level indicator and/or the runtime of the battery.

In the JPH 07294610 A, a possibility is disclosed to detect the remaining capacity of the battery by operating a self-discharging capacity based on self-discharging characteristics stored in a memory.

A further different approach for a battery level indicator, also applicable e.g. for NiMH batteries, is to count charge currents and discharge currents over time and to calculate the remaining capacity. But when not knowing exactly the charge and discharge currents, this also will result in a mismatch between indicated battery level on a display and the real remaining capacity. An exact measurement of the charge and discharge currents is extensive and power-consuming itself.

SUMMARY OF THE INVENTION

Accordingly, it is an object of the present invention to provide a possibility for indicating a low battery level in a battery-driven apparatus using rechargeable batteries which is able to indicate a low battery level as precisely as possible, preferably based on a required remaining running time of the apparatus.

This object is solved with a method according to claim 1 and an apparatus according to claim 11.

In line with the proposed method described at the beginning, it is provided that the running time of the apparatus, while driving the load, is accumulated since the last charging. During this running time of the apparatus (i.e. when said load is switched on), the accumulated running time is repeatedly stored as sequenced data logger entries in a data logger memory until a reset of said apparatus due to insufficient battery capacity or until charging of the battery. In line with the invention, said threshold for indicating low battery level is then determined after a (preferably after each) reset of said apparatus based on said data logger entries and a required remaining running time of said apparatus upon indication of low battery level.

One major advantage of the proposed invention is that after only one reset of the apparatus due to insufficient battery capacity, an accumulated running time history is available, preferably together with the values of the battery voltage measured during the accumulation of the running time as described below with respect to a preferred embodiment. Without measurement of the battery voltage, only the running time is accumulated.

The term "reset of the apparatus" is to be understood in line with this invention as a reset of the apparatus due to insufficient battery capacity.

One possibly for such a reset is an uncontrolled breakdown of the processor of the apparatus if the supply voltage of the battery is not sufficient to continue running of the processor. In this case it is necessary to charge the charge the battery before the processor and the apparatus will continue to work. However, the uncontrolled breakdown of the processor is generally an unwanted behavior as the shutdown is not controlled and the resulting state of the apparatus is void. Often, the processor will then start in a basic setup without any personal configuration by the user.

In contrast to an uncontrolled breakdown, another possibility for a reset of the apparatus due to insufficient battery capacity is a controlled shutdown of the processor in case of very low battery capacity. In this case, upon detection of a very low battery capacity, the processor might prepare a controlled shutdown and stop running the apparatus in a controlled manner. It can be provided that the apparatus can be switched on manually only after a charging of the battery. The detection of a very low battery capacity can in line with the invention be performed by measuring battery voltage and comparing the measured battery voltage to the low voltage threshold. With a supply voltage according to the low voltage threshold, the apparatus is supposed to not working properly any more. However, this low voltage threshold might be well above the necessary supply voltage of the processor of the apparatus so that no uncontrolled breakdown of the apparatus occurs at this voltage and the apparatus can be shutdown in a controlled manner. This low voltage threshold can be determined e.g. during the design of the apparatus and implemented as fixed threshold during the process of manufacturing, e.g. as a fixed software threshold. The advantage is that the processor continues to work at the reset of the apparatus due to insufficient battery capacity. No reset of the processor itself will disturb program execution.

The accumulated running time history is available from the very beginning after the last charging of the rechargeable battery until the reset of the apparatus due to insufficient battery capacity. This information can precisely be used to set a suited threshold indicating a low battery level in precisely defined conditions of the battery level and the apparatus. In particular, the remaining running time of the battery can be estimated according to a required remaining running time of the apparatus upon indication of low battery level, as the apparatus will behave similar in future when driving the load. This is in particular true for general appliances, e.g. in a household, in which the conditions of use (e.g. respective to the environmental temperature, time of use and/or schedule of use) do not alternate very much.

However, it is preferred to measure the battery voltage during accumulation of the running time, for example in said predetermined accumulated running time intervals, such as one minute of the accumulated running time. In this preferred embodiment, the battery voltage is repeatedly measured as a function of said accumulated running time and stored in a data logger memory as sequenced data logger entries containing at least the measured battery voltage and the accumulated running time at the moment of measurement. In case, the battery voltage cannot be measured, for example due to a temporary failure or the design of the apparatus, only the accumulated running time is saved as data logger entry. This is also considered as "measurement of the battery voltage" in line with the invention.

Such repeated storage of runtime and, optionally but preferred, measured battery voltage as data logger entries is continued until a reset of the apparatus due to insufficient battery capacity (as defined above) occurs or until the following charging of the battery is performed, even before a reset of said apparatus due to insufficient battery capacity. In line with the invention, said threshold for indicating low battery level is then determined after a (preferably after each) reset of said apparatus based on said data logger entries and a required remaining running time of said apparatus upon indication of low battery level.

The battery voltage measurement is preferably performed in predetermined accumulated running time intervals, e.g. every minute of the accumulated running time. This means that in the predetermined time intervals of the accumulated running time, when the load the apparatus is driven or operated, a battery voltage measurement is repeated.

According to a preferred embodiment of the invention, that threshold can be determined by evaluating said data logger entries going backwards in running time from the latest data logger entry before said reset of the apparatus due to insufficient battery capacity. This is a very straightforward evaluation of the data logger entries because the remaining running time of the apparatus can be estimated in analogy to the real behavior of the apparatus before such a reset.

In this regard it is emphasized that the accumulated running time according to the invention is directed only to the time when the apparatus is switched on, which means that said certain load of this apparatus is driven. For very preferred embodiments of the invention, with the apparatus being e.g. a toothbrush or an electric shaver, the certain load can be an electric motor. By accumulating the running time, when the load is driven and the energy drawn from the battery is high compared to a standby-modus, a very precise prediction of the remaining running time is possible. This is in particular true, if the daily schedule of use is usually similar.

One preferred possibility according to the present invention is that the threshold is determined as the measured battery voltage level of the one data logger entry with the accumulated running time corresponding to the difference between the latest accumulated running time before the reset of the apparatus and the required remaining running time, which might be parameterized according to the user's need or a predicted user's need already in factory. Accordingly, the threshold is defined as a battery voltage threshold measured while the load of the apparatus is driven. Advantageously, the indication of low battery level is thus given during or directly after the use of the apparatus, i.e. when the user normally takes notice of such an indication.

In an advantageous embodiment of the proposed method it is possible that the initial low battery voltage level, i.e. the factory setting or the setting before the first use of the apparatus (first use ever or after a change of the rechargeable battery), or in other words before the first determination of the threshold of the apparatus, is set to zero. In this case, the user will during the first use not be reminded to charge the battery. This occurs intentionally in order to save a complete history of data logger entries in the data logger memory which enables a very precise prediction of the remaining running time and in turn a very precise indication of a low battery level. A respective explanation can be given in the user instruction manual.

Another possibility to determine the threshold for an indication of low battery level, which also can be combined with the determination of the threshold as described before, is that the threshold is determined as a low battery accumulated running time value. This value may correspond to the difference between the latest accumulated running time before the reset of the apparatus and the required remaining running time. This alternative is also applicable in cases, where e.g. due to a failure of the battery voltage measurement no voltage levels are correlated with the accumulated running time in the data logger entries saved in the data logger memory. In case that both, the voltage measuring and the accumulated time are measured/determined and stored in the data logger memory, both values can be used to determine the threshold together. For example, in order to postpone the indication of a low battery level, the low level battery indicator might be switched on only, if both of the thresholds are exceeded. As a long lasting battery in one charging cycle is associated by the user with a high quality application, a combination of both thresholds might be advantageous. Further, if the late indication of the low battery level will result in an unintentional reset of the apparatus due to insufficient battery capacity, this has the positive effect that a new complete history of data logger entries is collected which can be made basis of a new and actually valid threshold determination.

According to a general aspect of the invention it is optionally proposed that a new threshold is determined based on the latest data logger entries after each reset of the apparatus due to insufficient battery capacity.

Preferably, for the determination of the threshold as low battery accumulated running time, the initial low battery accumulated running time value, i.e. the factory setting or the setting before the first use of the apparatus, is set to a value far behind the maximum accumulated running time obtainable with a rechargeable battery. For example, the initial value might be set to the double (or more) of the maximum accumulated running time obtainable under optimal conditions. Another possibility is to use as initial value for this threshold the highest possible value of the range of the software variable used in the software implementing said method in the processor of the apparatus. The effect is the same as described with respect to the initial low battery voltage threshold being zero.

It can be provided according to the proposed method in line with the invention that an accumulated low level running time is determined starting with the indication of low battery level until a reset of the apparatus due to insufficient battery capacity or until charging of the battery. In use of this accumulated low level running time, the threshold for indicating low battery level can according to the invention be lowered if the accumulated low level running time is exceeding the required remaining running time. This indicates that the reserve of battery energy is higher than necessary for the required remaining running time. In this case, an adaption of the threshold is possible on the fly, i.e. without a reset of the apparatus due to low battery capacity. Lowering of the threshold for indicating the low battery level means that the low battery level will be indicated later with respect to the accumulated running time, by lowering e.g. the low battery voltage level and/or increasing the low battery accumulated running time value time.

The amount of lowering of the threshold is according to a preferred embodiment of the invention corresponding to the difference between the accumulated low level running time and the required remaining running time. In this embodiment, the lowering of the threshold is independent of a reset of the apparatus due to insufficient battery capacity.

The invention is also directed to an apparatus having a load, a rechargeable battery for driving the load, an indicator for low battery level and a processor with a memory, the processor being adapted to control the indicator for low battery level. In line with the invention, the processor is further adapted, e.g. by software means stored in the memory of the processor in executable manner, to perform the method as described before or parts thereof. Further, the memory connected to the processor comprises a data logger memory. Accordingly, with the apparatus according to the present invention, the proposed method for indicating low battery level can be performed.

In order to save the data logger entries it is according to a preferred embodiment suggested that the data logger memory is a non-volatile memory. This means that the data logger entries are stored in that memory also in case of a reset of the apparatus due to insufficient battery capacity.

According to a preferred embodiment, the apparatus proposed is an electric toothbrush and/or an electric shaver. However, the invention is not restricted to such appliances, but will work with any other apparatus having a rechargeable battery as energy source. A preferred embodiment is the use of appliances for the household which are regularly used in particular every day, but for a period much shorter than one day. The typical use of the electric appliances is a use of 3 to 15 or 30 minutes a day once or at different daytimes.

Finally, the invention is related to a computer program product having program code means which are stored on a computer readable medium in order to carry out the method as described before or parts thereof if the computer program product is executed on a processor of an apparatus having a load, a rechargeable battery for driving the load, an indicator for low battery level and a processor with a memory.

DETAILED DESCRIPTION OF THE INVENTION

Figure 1:
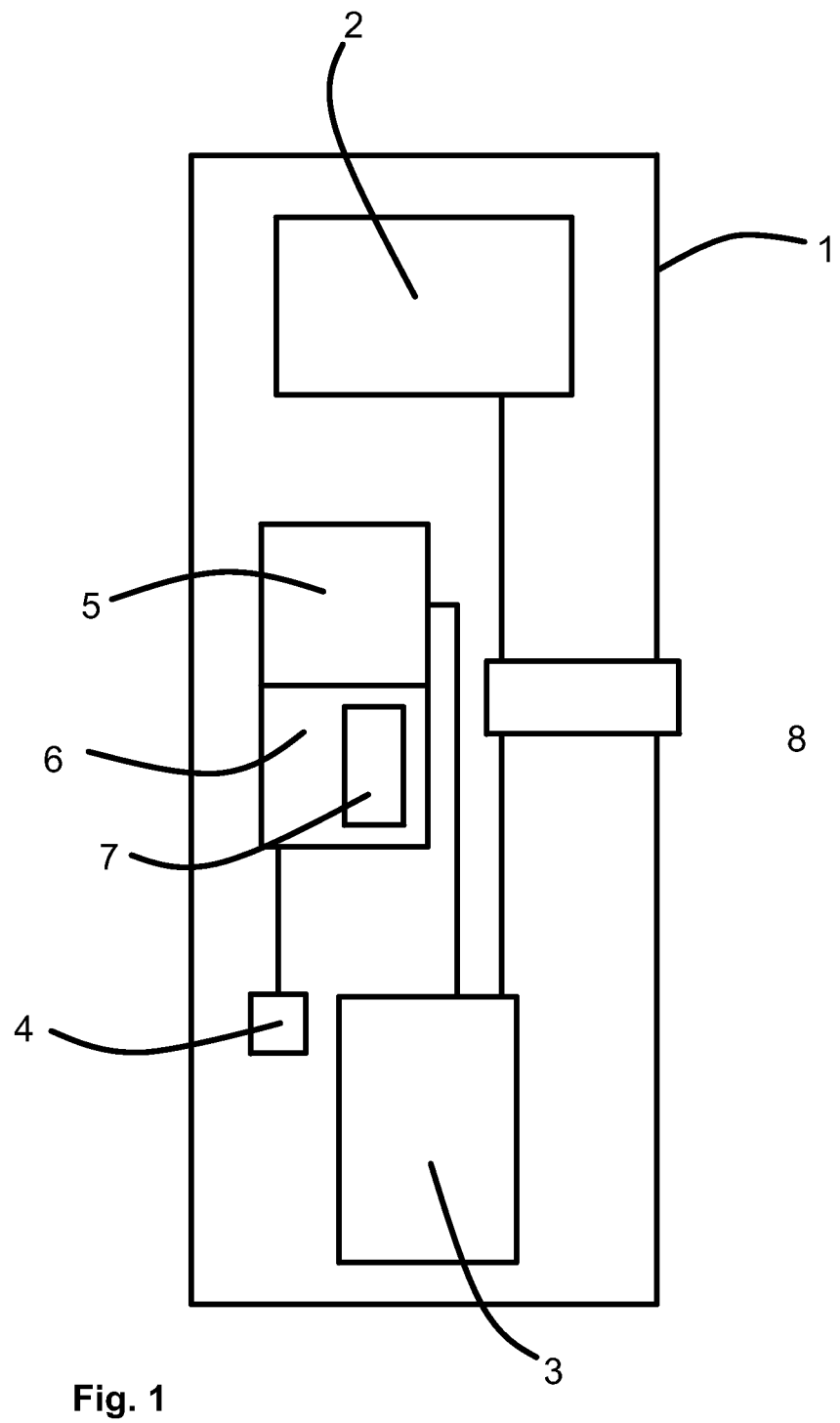
FIG. 1 shows a schematic view of an apparatus according to a preferred embodiment the invention.

The apparatus 1 shown in FIG. 1 has a load 2, a rechargeable battery 3 for driving the load 2, an indicator for low battery level 4 and a processor 5 with a memory 6, the memory 6 comprising a data logger memory 7 the function of which will be explained later. According to a preferred embodiment, the load 2 can be an electric motor. The apparatus 1 can be a toothbrush, shaver or the like.

Processor 5 is adapted by software means stored in the memory 6 of the processor 5 in executable manner to perform a method for determining the battery level of a rechargeable battery 3 used in a battery driven apparatus and for indicating based on this determination a low battery level showing the need to recharge the battery 3. The load 2 of the apparatus 1 can be switched on by a switch 8.

FIG. 1 is only a schematic view of the main components of an apparatus 1 according to the invention. FIG. 1 does not represent all connections and relationship between the different components of the apparatus 1.

Figure 2:
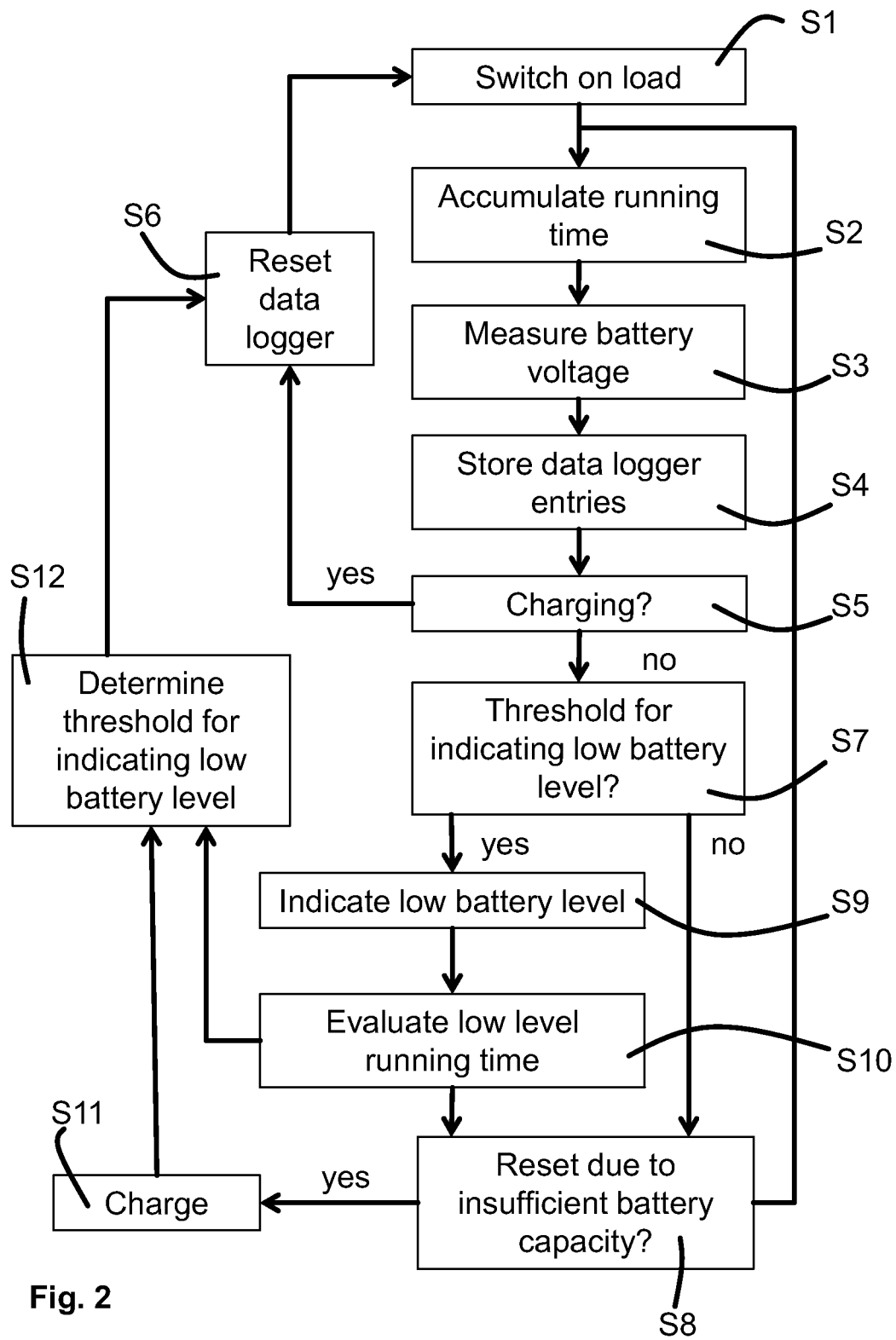
FIG. 2 shows a preferred embodiment of the method for indicating low battery voltage according to the invention.

In the following, the proposed method for indicating a low battery level is described according to a preferred embodiment depicted in FIG. 2

By switching on the load 2 of the apparatus 1 with the switch 8, the processor 5 recognizes the switching on of the load 2 in step S1. This can be performed by sensing the current driving the load 2 or by switching the current by the processor itself with switch 8 being connected to processor 5.

While the load 2 is driven, the processor 5 accumulates the running time in step S2. The accumulated running time value is reset to zero after each charging of the battery 3. After a reset, the running time of the load 2 is accumulated until the next charging of the battery or a reset of the apparatus 1 due to insufficient battery capacity.

After predetermined accumulated running time intervals, e.g. every minute of the accumulated running time, the battery voltage is measured in step S3, preferably while the load 2 is switched on.

After a battery voltage measurement, the measured voltage is stored together with the accumulated running time in the data logger memory 7 as one data logger entry (step S4). In a further step S5, that might be performed directly after step S4 or somewhere else in the step sequence, it is checked, whether the battery 3 is charged. In case of charging the battery 3, the data logger, i.e. the data logger entries in the data logger memory 7, are reset (Step S6) and, upon next switching on of the apparatus 1, steps S2 to S4 are repeated.

As long as no charging occurs, it is checked in step S7 whether the threshold for indicating a low battery level. As long as this threshold is not traversed and no reset of the apparatus 1 due to insufficient battery capacity is performed (step S8) processor 5 continues to accumulate the running time as long as the load 2 is switched on. If the load 2 is switched off, the accumulation of the running time is caused until the load 2 is switched on again in step S1. This pause is not shown in FIG. 2.

If the threshold for indicating low battery level is exceeded in step 7, the low battery level will be indicated with indicator 4 of the apparatus 1 (step S9). After step S9, the process continues with step S8 determining, whether a reset due to insufficient battery capacity occurs.

Step S10 will be described later, being an optional step according to this embodiment and directed to an evaluation of a low level running time.

In case of a reset of the apparatus 1 due to insufficient battery capacities, battery 3 of the apparatus 1 has to be charged in step S11. After or during charging in step S11, the processor 5 is adapted to determine in step S12 a new threshold for indicating a low battery level based on the data logger entries stored in step S4. After the determination of new threshold, the process is continued as described with accumulating the running time after switching on the load 2 in step 1. Further, after a reset of the apparatus 1, also the data logger will be reset (step S6).

So each time the apparatus 1 is reset to insufficient battery capacity, an update of the threshold for indicating low battery level is performed. Thus, according to the proposed method, the data logger tracks the battery voltage over the running time, i.e. while the load 2 of the apparatus 1 is switched on, while the battery 3 gets empty after a respective charging. Once the application resets due to insufficient battery capacity over energy, the data logger recordings are still available as well as the reset circumstances, which are stored in the data logger memory 7 being implemented at a non-volatile memory.

The advantage of this process is that the indication of a low battery level of the battery 3 of the apparatus 1 can be switched on precisely, when a certain remaining running time of the battery energy is reached. The threshold indicating this remaining running time can be very precisely defined.

The purpose of such a low battery indication is, of course, to show the need to recharge the battery 3. But it is also important, to give the user enough time to finish the current operation before the application resets. This will be explained by the example of an electric toothbrush as apparatus 1. In this application, the user shall be able to complete two minutes of brushing the teeth as well as enabling the rest of the family to complete brushing, e.g. brushing before going to sleep. So, the residual charge of the battery 3 after indicating a low battery level should allow a remaining running time of e.g. 4 to 6 or 8 minutes of required remaining running time. This required remaining running time is about 10% of a fully charged battery 3.

With all variation and correlation problems in determining the actual battery capacity, one might in a conventional apparatus according to the prior art reserve a time of about 25 minutes (corresponding 40 percent of the run time) to ensure a weak battery indication with sufficient remaining time under all conditions, especially aging of the battery.

However, this leads to an early indication of a low battery level. Users will experience this as low quality. It is therefore advantageous to determine the remaining running time more precisely also if the battery 3 of the apparatus 1 is getting older and shows some aging effect. This is in line with the invention performed by evaluating the data logger entries and the data logger memory, as will be explained with respect to FIG. 3 in the following.

Figure 3:
FIG. 3 shows an example of data logger entries.

FIG. 3 shows the latest 8 minutes of a together 48-minute run time of the load 2 in the apparatus 1 as data logger entries 9 in the data logger memory 7. After a run time of 40 minutes, the battery voltage measured corresponds to 1.20 V. With a predetermined accumulated running time intervals of 1 minute, the data logger entries 9 show the corresponding battery voltage for each minute of the accumulated running time. The latest entry before a reset is shown at 48 minutes with a voltage of 0.87 V. By looking backwards, starting from the reset, in time, the run time/voltage point is found where the low battery indication should have been given. In the example of FIG. 3, if a low battery indication should be given 5 minutes before the rest of the application, i.e. with a required remaining running time of 5 minutes, a voltage level reached at a running time of 43 minutes should be used as threshold for indicating a low battery level. This voltage threshold according to the example of FIG. 3 is 1.13 V.

By always tracking voltage and running time until a reset of the apparatus 1, aging effects will be compensated each time the application gets into a reset.

To initially set a valid low battery threshold, the factory settings of low battery level will be set to zero. So, the consumer will initially not be given the indication to charge the battery. Accordingly, no warning is given before reset of the apparatus. After charging the batteries 3 after this reset, the voltage threshold will be adapted as described with respect to step S10.

With the proposed method it is not even a problem, if users never use the application until reset. They still face no problems in use until the capacity of the battery is decreased by aging so far that at a given point the low battery indication could no longer be given before a reset. In this case, a reset occurs. After the reset and a charging of the battery, a new low battery threshold will be estimated according to the invention.

If a measurement of the battery voltage is not possible or the current consumption is not varying very much, the low battery indication can be activated only time driven. Also a combination of a time driven and a voltage driven indication of a low battery level is possible. In case of a time driven activation for indicating a low battery level, the data logger is used to only count the overall use time (accumulated running time) starting from a full charge until a reset. This is shown in the right column (Runtime) of FIG. 3. The voltage level is in this case not used. Only the running time until a reset is counted. After reset, the required or desired remaining running time is used to estimate the run time after which the low battery indication should be switched off. In the above example of FIG. 3, a time driven low battery indication will start after 43 minutes of usage in order to gain access to 5 additional minutes of run time before a reset. Also, this time driven threshold will be updated after each reset.

Finally, the evaluation of a low level running time in step S10 is described. After the indication of a low battery level in step S9, a second time counter is activated accumulating the running time with an active low battery level indication. If this accumulated low level running time is exceeding the required remaining running time, the threshold for indicating a low battery level can be adjusted as described before. In this case, after determining the threshold it is not necessary to also reset the data logger (as shown in FIG. 2). It is instead possible to continue the accumulation of the running time as shown after step S8 in case no reset occurs.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method for determining the battery level of a rechargeable battery (3) used in a battery-driven apparatus (1) for driving a load (2) and for indicating a low battery level after a last charging, the method comprising a repeating measurement of the battery voltage and a determination of a threshold for indicating the low battery level, wherein the running time of the apparatus (1), while driving the load (2), is accumulated since the last charging, the accumulated running time is repeatedly stored as sequenced data-logger entries (9) in a data-logger memory (7) until a reset of the apparatus (1) due to insufficient battery capacity or until charging of the battery (3), and wherein the threshold is determined after a reset of the apparatus (1) based on the data-logger entries (9) and a required remaining running time of the apparatus (1) upon indication of low battery level.

2. The method according to claim 1, wherein the battery voltage is repeatedly measured as a function of the accumulated running time and stored in the data-logger memory together with the accumulated running time as sequenced data-logger entries containing the measured battery voltage and the accumulated running time during the measurement.

3. The method according to claim 1, wherein the threshold is determined by evaluating the data-logger entries going backwards in running time from the latest data logger entry before the reset of the apparatus.

4. The method according to claims 2, wherein the threshold is determined as the measured battery voltage of the one data-logger entry with the accumulated running time corresponding to the difference between the latest accumulated running time before the reset of the apparatus and the required remaining running time.

5. The method according to claim 4, wherein the initial low battery voltage threshold is set to zero.

6. The method according to claim 1, wherein the threshold is determined as low battery accumulated running time value corresponding to a difference between the latest accumulated running time before the reset of the apparatus and the required remaining running time.

7. The method according to claim 6, wherein the initial low battery accumulated running time value is set to a value far below the maximum accumulated running time obtainable with the rechargeable battery.

8. The method according to claim 1, wherein an accumulated low-level running time is determined starting with the indication of low battery level until a reset of the apparatus due to insufficient battery capacity or until charging of the battery, and wherein the threshold for indicating the low battery level is lowered if the accumulated low-level running time is exceeding the required remaining running time.

9. The method according to claim 8, wherein lowering of the threshold is corresponding to the difference between the accumulated low-level running time and the required remaining running time.

10. An apparatus having a load (2), a rechargeable battery (3) for driving the load (2), an indicator (4) for low battery level, and a processor (5) with a memory (6), the processor being adapted to control the indicator for low battery level, wherein the processor is structured and configured to perform the method of claim 1 and wherein the memory comprises a data-logger memory (7).

11. The apparatus according to claim 10, wherein the data logger memory is a non-volatile memory.

12. The apparatus according to claim 10, wherein the apparatus is selected from the group consisting of an electric toothbrush and an electric shaver.

13. A computer-program product having a program code stored on a computer-readable medium for carrying out the method of claim 1, wherein the computer-program product is executed on a processor (5) of an apparatus (1) having a load (2), a rechargeable battery (3) for driving the load (2), an indicator (4) for low battery level, and the processor (5) with a memory (6).

* * * * *